United States Patent [19]

James

[11] 4,415,115
[45] Nov. 15, 1983

[54] BONDING MEANS AND METHOD

[75] Inventor: Kristi L. James, Phoenix, Ariz.

[73] Assignee: Motorola, Inc., Schaumburg, Ill.

[21] Appl. No.: 271,444

[22] Filed: Jun. 8, 1981

[51] Int. Cl.³ ............................................. B23K 31/02
[52] U.S. Cl. .................................... 228/170; 228/179; 228/4.5
[58] Field of Search ................... 228/4.5, 44.1 A, 1 R, 228/170, 179, 110; 361/408, 403

[56] References Cited

U.S. PATENT DOCUMENTS 3,087,239  4/1963  Clagett ................................. 228/170
3,643,321  2/1972  Field .................................... 228/4.5

FOREIGN PATENT DOCUMENTS 55-151344  11/1980  Japan ..................................... 228/179

OTHER PUBLICATIONS

Jerry Lyman, *Chip-Carriers Move into Prototyping*, Electronics, Dec. 4, 1980, p. 48.

*Primary Examiner*—Nicholas P. Godici
*Assistant Examiner*—Marc Hodak
*Attorney, Agent, or Firm*—Robert M. Handy

[57] ABSTRACT

A new wire bonding capillary design is employed in which the bonding and cutting surfaces of the bonding capillary are separated. The bonding capillary tip has an annular bonding surface and an annular cutting ridge raised from the bonding surface and of smaller diameter.

11 Claims, 11 Drawing Figures

FIG 2 — PRIOR ART

— PRIOR ART —

— PRIOR ART —

BUNDING MEANS AND METHOD

BACKGROUND OF THE INVENTION

1. Field of the Invention

This invention relates, in general, to means and methods for improved bonding of wires to substrates, more particularly to the design and use of an improved bonding tool and bonding capillary to produce improved wire bond interconnections in electrical devices, especially semiconductor devices, and to electrical devices having improved bonds thereon.

2. Description of the Prior Art

Wire bonding is much used to provide lead wires and/or interconnect wires for electrical devices, especially semiconductor devices. The wires may be bonded to contact pads by use of pressure, heat, vibrational energy, or a combination thereof. Ordinarily, the wire welds to the contact pad without the use of solders or fluxes by the intimate mixing of the pad material and the wire material at the interface.

"Thermal compression" refers to bonding by means of the application of heat and pressure. "Ultrasonic" refers to bonding achieved as a result of the scrubbing action made possible through the application of ultrasonic vibrational energy to the bond interface. "Thermosonic" refers to bonding achieved by the use of a combination of heat, pressure, and ultrasonic energy.

Gold, aluminum, silver, and copper in pure or alloy forms, are typical bonding wire materials. For semiconductor device applications, wire dimensions are usually 0.5 to 25 mils (0.013–0.64 mm), 0.7 to 2 mils (0.018–0.051 mm) being most common. Contact pads on semiconductor devices are frequently formed from aluminum, gold, copper, silver, or other metals in pure or alloyed form. Contact pads on device mounting frames or package leads are frequently made from gold, aluminum, copper, silver, nickel, iron, and/or common alloys such as, for example, Kovar (Kovar is a registered trademark). The various contact pad materials may be created by evaporation, plating, sputtering, screen printing, or formed from bulk material, each of which produces different surface conditions and bonding properties.

As used herein, "substrate" refers to a contact pad or other region to which a wire is or is to be bonded.

Bond strength refers to the force required to destroy the bond by breaking the bonding wire or separating it from the substrate. Bond strength depends on the wire size, wire material, contact material, bond area, bond shape, and bonding method. It is generally desired that the bond strength be greater than the tensile strength of the wire so that failure occurs as a result of wire breakage rather than bond separation, since this provides the maximum bond strength for a given wire size and material. Achievement of this condition, however, has not always been possible in the prior art, particularly with materials such as copper to which it has previously been difficult to make a proper bond.

Thus, a need continues to exist for a means and method for achieving wire bonds having improved pull strengths, particularly on copper or copper alloys so as to avoid the use of precious metals on bonding surfaces, and for electrical devices having wire bond connections whose strength is determined by the tensile strength limit of the wire rather than the bond interface.

Accordingly, it is an object of the present invention to provide an improved bonding means giving improved bond pull strengths.

It is an additional object of this invention to provide an improved bonding means giving a bond region of substantially uniform thickness.

It is a further object of this invention to provide an improved bonding means having two regions on the bonding surface, one for providing the bonding action, and a second non-planar with the first for providing for cut-off of the bond wire.

It is an additional object of this invention to provide an improved process for producing single or multiple wire bonds to contact regions of substrates.

It is a still further object of this invention to provide electrical devices having improved wire bonds.

SUMMARY OF THE INVENTION

The above and other objects and advantages are achieved in accordance with the present invention wherein there is provided a bonding tool having a bonding capillary, in which the bonding capillary contains a central bore for receiving a bonding wire, and a conical tip on which is located a substantially annular bonding surface surrounding the bore, the bonding surface having thereon a raised annular cutting ridge of predetermined height and extent adjacent to the bore and of smaller dimensions than the bonding surface, and wherein the bonding surface is used to apply pressure, optionally in the presence of heat and/or vibrational energy, to press a portion of the wire against a contact pad region, deforming this portion of the wire to a substantially uniform thickness and achieving bonding between the wire and the contact pad, and wherein the annular cutting ridge serves to separate or cut the wire remaining in the capillary free from the bonded portion, and at the same time substantially controlling the thickness of the bonded region of the wire. During bonding the tool places the bonding surface of the capillary substantially parallel to the contact pad region to which the wire is being bonded.

In another embodiment, the cutting ridge make only a half-circle (approximately) around the central axis of the capillary bore. Multiple bonds can be made without cutting the wire using the portion of the bonding surface without the ridge. For the last bond, the capillary is rotated approximately 180 degrees so that the cutting ridge engages and cuts the wire during bonding.

In a further embodiment, electrical devices having improved wire bonds are fabricated using the improved tool and capillary.

BRIEF DESCRIPTION OF THE DRAWINGS

FIG. 2 shows a simplified cross-section of an enlargement of the tip portion of the bonding capillary of FIG. 1 according to the prior art;

DETAILED DESCRIPTION OF THE DRAWINGS

Figure 1:
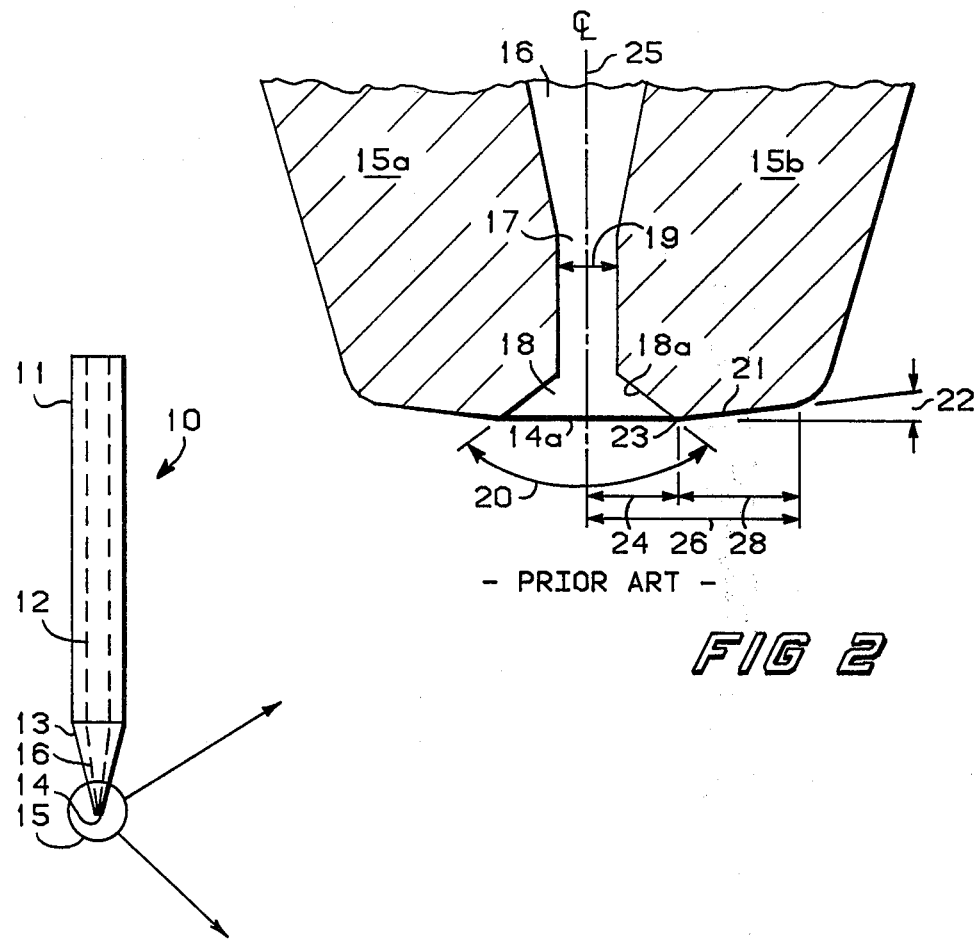
FIG. 1 shows a side view in simplified form of a bonding capillary.

FIG. 1 shows in simplified form the side view of capillary 10 having body region 11, conical tip region 13 terminating in end 14. Capillary 10 has bore 12 penetrating throughout its length. Region 16 of bore 12 tapers to a smaller diameter. Region 15 surrounding tip end 14 is shown in enlarged form in FIGS. 2, 3 and 6A-B.

FIG. 2 shows cross-section 15a-b, in greatly enlarged and simplified form, of capillary end region 5 adjacent tip end 14 according to the prior art. Tapered bore region 16 communicates with substantially cylindrical bore guide region 17 which terminates in bore throat region 18 adjacent to tip end 14a. Bore guide region 17 has diameter 19 slightly larger than the diameter of the wire desired to be bonded. Bore throat region 18 has a substantially conical shape with included angle 20. Cross sectional end region 15a-b is substantially cylindrically symmetric around center line 25. Bonding surface 21 of end region 15a-b surrounding bore throat 18 makes angle 22 with respect to the plane defined by tip end 14a. Heel 23 formed by the intersection of bonding surface region 21 and sidewall 18a of bore throat region 18 is of substantially circular form. Radius 24 of heel 23 is also the inner radius of bonding surface region 21. Bonding surface region 21 is of substantially conical shape and has radial width 28 lying between inner radius 24 and outer radius 26.

Figure 3:
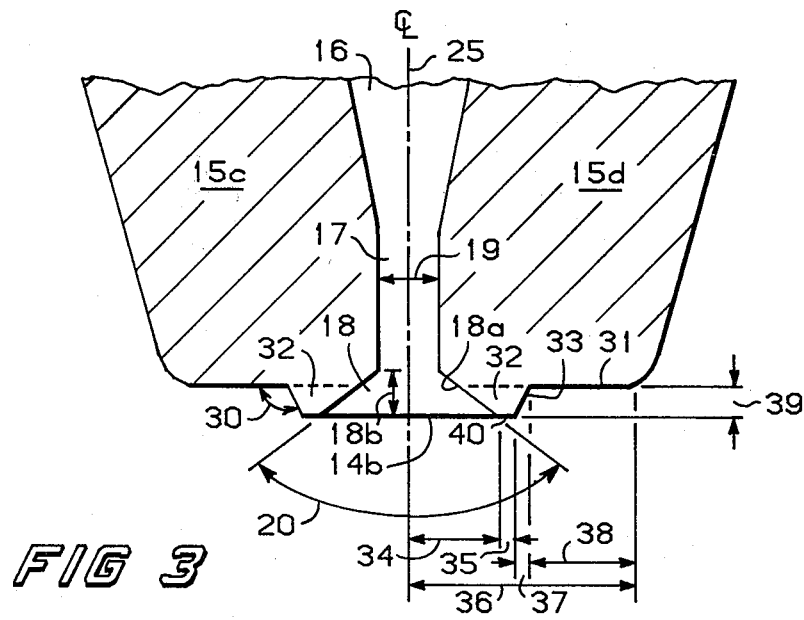
FIG. 3 shows a cross-section in simplified form of an enlargement of the tip portion of the capillary of FIG. 1 according to the present invention.

FIG. 3 shows a cross section 15c-d, in greatly enlarged and simplified form, of capillary end region 15 adjacent tip end 14 according to the present invention. Cross sectional end region 15b-c of the present invention is substantially cylindrically symmetric around center line 25. Bonding surface region 31 of end region 15b-c is substantially annular or washer shaped and is substantially parallel to tip end 14b and displaced therefrom by distance 39. Bonding surface region 31 has formed or mounted thereon annular cutting ridge 32 having substantially conical sloping faces 18a and 33. Face 33 makes angle 30 in the range 90° to 150° with bonding surface region 31. Ridge 32 has lower face 40 having inner radius 34 and radial width 35. Outward sloping face 33 of ridge 32 has radial width 37. Bonding surface region 31 has radial width 38 and outside radius 36. Tapered bore region 16 communicates with substantially cylindrical bore guide region 17 of diameter 19 which terminates in bore throat region 18 having included angle 20 in the range 90° to 150° adjacent tip end 14b.

For good bonding performance it has been found that the dimension of various portions of the tip of FIG. 3 should be scaled with the wire size, according to the following relations, expressed in units of the wire size unless otherwise noted. The useful and preferred ranges of angles 20 and 30 are included. An example of the nominal dimensions for a tip used for bonding wires of 1.0 to 1.25 mil (25 to 32 μm) diameter is also given.

| | Item | Size Range (In multiples of Wire Size) | Nominal Size in μm for 25 to 32 μm Wire |
|---|---|---|---|
| 1. | Diameter 19 of bore guide region 17 | 1.5 to 1.2 | 38 |
| 2. | Height 39 of cutting ridge 32 | 0.5 to 0.25 | 13 |
| 3. | Width 35 of cutting ridge 32 | 0.5 to 0.40 | 13 |
| 4. | Width 38 of bonding surface 31 | 2.0 to 1.6 | 51 |
| 5. | Depth 18b of bore throat 18 | 1.5 to 0.7 | 30 |
| 6. | Angle 20 of bore throat 18, in degrees | 90° to 150° (120° ± 10° preferred) | 120° |
| 7. | Angle 30 of cutting ridge 32, in degrees | 90° to 150° (120° ± 10° preferred) | 120° |

It should be noted that annular cutting ridge 32 lies between bore throat region 18 and bonding surface 31, and has a smaller diameter and a smaller area than annular bonding surface 31.

Figure 4B:
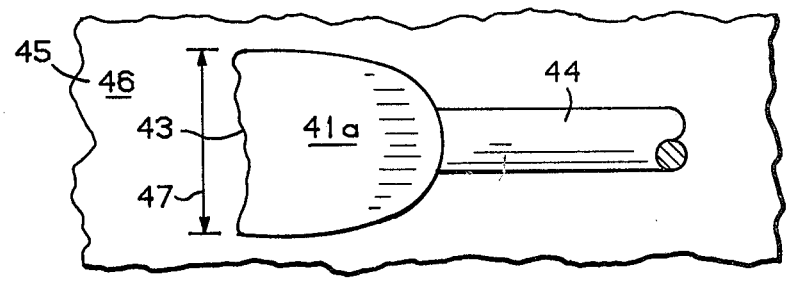
FIG. 4B is a top view, in simplified form, of the wire bond of FIG. 4A.
Figure 4A:
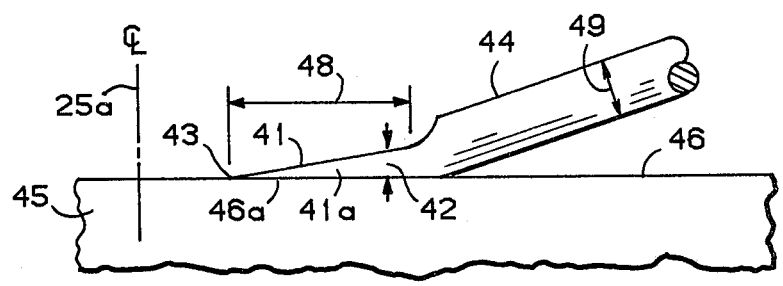
FIG. 4A shows, in simplified form, a side view of a wire bond between a wire of circular cross-section and a planar substrate, made according to the prior art.

FIGS. 4A and 4B show, respectively, a side view and top view in simplified form of the results of bonding wire 44 of diameter 49 to surface 46 of substrate 45 using a bonding capillary having a prior art shape of the type illustrated in FIG. 2. During the bonding operation, bonding surface 21 of capillary 10 deforms or crushes wire 44 to produce deformed surface 41 and to effectuate a bond between wire 44 and substrate 45 at surface location 46a. Deformed wire surface 41 makes angle 42 with respect to surface 46 which corresponds approximately to angle 22 of FIG. 2. As a result of the deforming action during bonding, the material of wire 44 having diameter 49 is spread into substantially fan-shaped bonding region 41a of lateral width 47 and longitudinal extent 48. Longitudinal extent 48 corresponds approximately to bonding surface radial width 28 of FIG. 2. Heel 23 of bonding surface 21 (FIG. 2) provides a cutting action to sever wire 44 along line 43. Line 25a of FIG. 4A shows the approximate location during the bonding operation of center line 25 of capillary end region 15a-b of FIG. 2.

Figure 5B:
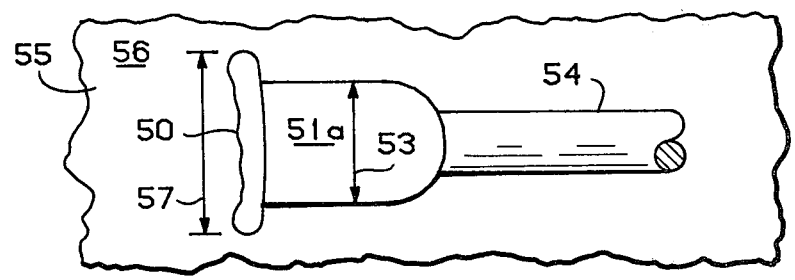
FIG. 5B is a top view, in simplified form, of the wire bond of FIG. 5A.
Figure 5A:
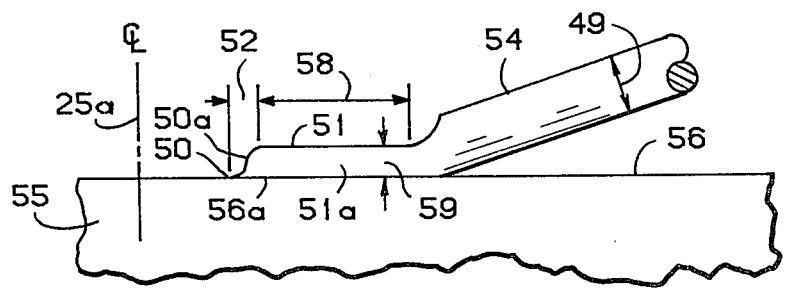
FIG. 5A shows, in simplified form, a side view of a wire bond between a wire of circular cross-section and a planar substrate, made according to the present invention.

FIGS. 5A and B show, respectively, a side view and top view in simplified form of a bond made according to the present invention. Wire 54 of diameter 49 is bonded to substrate 55 on surface 56 by means of bonding capillary 10 having end region configuration 15c-d of FIG. 3. Wire 54 is compressed by bonding surface 31 of FIG. 3 to form deformed or crushed bonded region 51a and effectuate a bond between wire 54 and substrate 55 in surface bonding region 56a. However, because of the shape of bonding surface 31 and the presence of annular cutting ridge 32 of FIG. 3, bonded region 51a of wire 54 has substantially constant height 59 between deformed wire surface 51 and substrate surface 56, and has longitudinal bonded dimension 58 corresponding approximately to radial width 38 of bonding surface 31 of FIG. 3. Since the wire deformation during bonding of wire 54 is limited by the presence of cutting ridge 32 to a height 59 corresponding substantially to height 39 of FIG. 3, lateral dimension 53 of bonded region 51a is substantially constant along dimension 58 and smaller than corresponding dimension 47 of the prior art bond of FIG. 4A-B. During bonding, cutting face 40 of annular cutting ridge 32 (FIG. 3) is pressed against surface 56 of substrate 55 to effectuate a cutting of the wire 54 at cut-off line 50, and produces sloping region 50a of width 52 corresponding approximately to surface 33 of lateral width 37 of FIG. 3. Since the material of wire 54 must be crushed to substantially zero thickness at cutoff line 50, width 57 of cut-off line 50 is larger than width 53 of bonded region 51a and is approximately comparable to maximum width 47 of bonded region 41a of the prior art (FIGS. 4A-B).

A number of tests were performed using 1.0 and 1.25 mil (0.025 and 0.032 mm) gold wires bonded to a variety of different surfaces. The results are shown in Table I for 1.25 mil (0.032 mm) gold wire. To simplify comparison, pull strength data taken on wires of different diameter were converted to 1.25 mil (0.032 mm) equivalent data by multiplying the measured pull strength by the square of the ratio of the wire diameters. For example, pull strength data obtained on 1.0 mil (0.025 mm) wire was converted to 1.25 mil (0.032 mm) data by multiplying the measured pull strength by a factor of 1.56. Table I provides a side-by-side comparison of the results obtained from bonds made utilizing the prior art capillary design compared to bonds obtained using the improved capillary design of the present invention. A variety of different substrate surfaces was used. The number shown in parentheses following the description of each surface of Table I indicates the number of tests performed on that surface. The force required to produce failure and the method of failure were determined, that is, whether failure occurred due to wire breaking or bond lifting. Wire breaking corresponds to tensile failure of a portion of the wire and indicates that the bond strength exceeded the wire strength. Bond lifting corresponds to separation of the bonded region from the substrate surface and indicates that the strength of the bonded region was less than the ultimate tensile strength of the wire. In Table I, the occurrence of wire breaks and bond lifts is indicated as a percentage of the total failures. In addition to obtaining the pull strength in grams ($10^{-3}$ kg), the standard deviation of the data was also determined and is included in Table I.

nominally of 97.5% copper, 2.35% iron, 0.03% phosphorus, and 0.12% zinc.

The pull strength measurements were made in the following way. The capillary, whether of the prior art type or the improved type of the present invention, was used to make a "ball" bond and a "stitch" bond. A short section of wire protruding from the bore of the capillary was heated in a flame to form a ball. This ball was then used to make a ball bond on the substrate. The capillary was then traversed, feeding wire from the bore of the capillary at the same time, and a second "stitch" bond made to the same substrate in a new location. The bonding wire was cut during the stitch bond operation so that there was left behind on the substrate a bonded portion of the wire consisting of a ball bond at a first end and a stitch bond at a second end with a loop of wire connecting the two. Care was taken to insure that the traverse distance and loop height were the same, insofar as possible, for all tests. The standing loop of wire between the first and second bonds was engaged by the hook of the pull strength tester which then pulled on the wire loop in a direction perpendicular to the substrate until failure occurred. In no case did failure occur at the ball bond. Failure occurred either as a result of tensile failure in the wire or lifting of the stitch bond from the substrate. During the pull test the standing wire loop formed an approximately triangle shape with the bonded wires making about a 45° angle to the substrate. General procedures for making ball bonds, stitch bonds, and pull-strength tests are well known in the art.

As shown in Table I, the capillary of the present invention gave results equivalent to the prior art capillary on plated gold and plated silver surfaces. Small differences in pull strengths are not significant. On copper alloy surfaces, however, the improved capillary of the present invention provided good pull strength and bond failure was substantially as a result of wire breakage rather than bond lifting, while the prior art capillary gave significantly lower pull strength and bond failure was caused by bond lifting. Additionally, the improved capillary and bonding method of the present invention gave excellent results on evaporated aluminum films. Tests performed using the prior art capillary design and methods on evaporated gold films gave poor results because of the large percentage of bond lifts. For the

TABLE I

| | | 1.25 mil (0.032 mm) GOLD WIRE BOND PULL TEST RESULTS | | | | | | | |
|---|---|---|---|---|---|---|---|---|---|
| | | PRIOR ART CAPILLARY BONDS | | | | IMPROVED CAPILLARY BONDS | | | |
| Test | Substrate Surface | Pull Strength ($10^{-3}$ kg) | Std. Deviation | % Wire Breaks | % Bond Lifts | Pull Strength ($10^{-3}$ kg) | Std. Deviation | % Wire Breaks | % Bond Lifts |
| 1 | Plated Gold (60) | 12.0 | 1.7 | 100 | 0 | 13.2 | 1.9 | 98 | 2 |
| 2 | Copper Alloy (60) | 3.9 | 3.6 | 0 | 100 | 11.8 | 2.1 | 100 | 0 |
| 3 | Copper Alloy (230) | | | | | 13.0 | 9.1 | 97 | 3 |
| 4 | Plated Silver (60) | 10.4 | 2.3 | 100 | 0 | 13.5 | 2.2 | 100 | 0 |
| 5 | Evaporated Gold (60) | 10.1 | 3.3 | 69 | 31 | | | | |
| 6 | Evaporated Aluminum (60) | | | | | 13.4 | 1.7 | 100 | 0 |
| | AVERAGE | 9.1 | 2.7 | 67 | 33 | 13.0 | 3.4 | 99 | 1 |

A variety of different substrate surfaces was tested, including plated gold on copper alloy, plain copper alloy, plated silver on copper alloy, evaporated gold on silicon and evaporated aluminum on silicon. The evaporated gold and aluminum layers were nominally 1 μm thick. The plated gold and silver layers were respectively 50 and 100 micro-inch (1.27 and 2.54 μm) thick. The copper alloy substrates used both for direct bonding tests and as a support for the plated surfaces were made from Olin 194, a commerical alloy consisting combination of substrate surfaces tested, the improved capillary design and bonding method gave good results overall, whereas the prior art capillary design and method gave poor results in several instances. It is further apparent from the results shown in Table I that the improved capillary design and bonding method produces pull strengths which correspond substantially to the tensile strength of the wire and which are not limited by the stitch bond adhesion.

While the improved capillary design of FIG. 3 has been illustrated for the case of a preferred cylindrically symmetric capillary and tip with a cylindrical bore, it will be apparent to those of skill in the art that other shapes are possible. Correspondingly, while it is preferred that bonding surface 31 of FIG. 3 have a round annular shape, it will be apparent to those of skill in the art that other annular shapes (e.g. square, triangular, polygonal, etc.) may be utilized. Cutting ridge 32, while also preferred to be of round annular shape, may have other annular shapes, for example, corresponding to the shape of bonding surface 31.

The bonding tip shape illustrated in FIG. 3 is cylindrically symmetrical around center line 25 so that cross-sectional regions 15c and 15d are substantially identical. An alternative embodiment illustrated in FIGS. 6A-B can be used in which left-half cross-section 15e differs from right-half cross section 15f in that cutting ridge 62 is present only on the right-half cylinder (e.g. 15f). By orienting the capillary as in FIG. 6A, bonding wire 64 can be arranged to feed out in direction 67a underneath bonding surface 61 and ridge 62. Conversely, by orienting the capillary as in FIG. 6B, bonding wire 64 can feed out in direction 67b under bonding surface 63. When the wire-capillary configuration of FIG. 6A is pressed against a substrate surface to effecutate bonding, portion 64a of wire 64 will be bonded to the substrate utilizing bonding surface 61 and simultaneously cut by cutting ridge 62 so that portion 64c of wire 64 is disconnected from portion 64a and remains within the capillary.

Figure 6A:
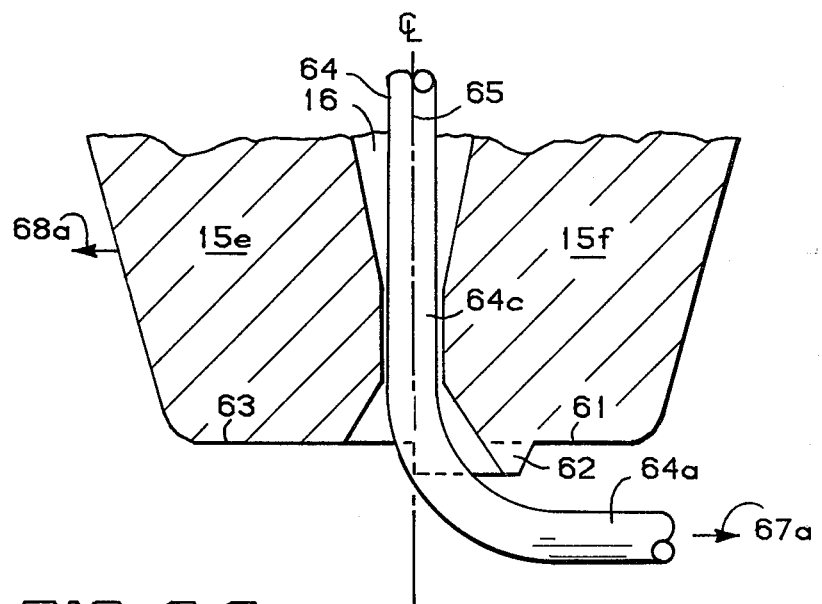
FIGS. 6A-B show, in simplified form, a cross section of an enlargement of the tip portion of the capillary of FIG. 1 according to another embodiment of the present invention.
Figure 6B:
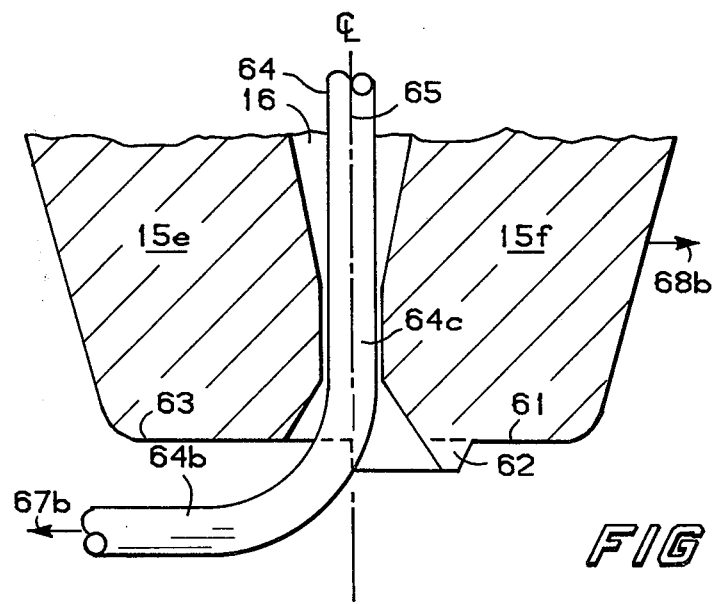

Conversely, when the wire-capillary configuration of FIG. 6B is utilized, portion 64b of wire 64 will be bonded to the substrate surface using bonding surface 63. Since no cutting ridge is present on bonding surface 63, wire 64 will not be severed and portion 64c will remain continuous with portion 64b, permitting a subsequent bond to be made with the same continuous wire. The thickness of the bonded region is determined substantially by the height of cutting ridge 62, since ridge 62 limits the amount of wire deformation obtained. In this fashion, any number of connected bonds may be made by traversing the capillary in direction 68b so as to draw wire 64 out in direction 67b. On the last bonding traverse, the capillary is rotated approximately 180 degrees about centerline 65 and moved in direction 68a so as to draw wire 64 out in direction 67a, and thereby cut wire 64 with the final bond.

While the alternative embodiment of FIGS. 6A-B has been illustrated for the case wherein bonding tip regions 15e–15f of capillary 10 are half-cylinders, it will be apparent to those of skill in the art that other combinations of bonding surfaces 61 and 63 and cutting ridge 62 on capillary 10 are possible provided that cutting ridge 62 is present only on a portion of bonding surfaces 61 and 63, lies next to but does not completely encircle bore hole 16, and has a smaller radial extent than bonding surface 61.

Figure 7:
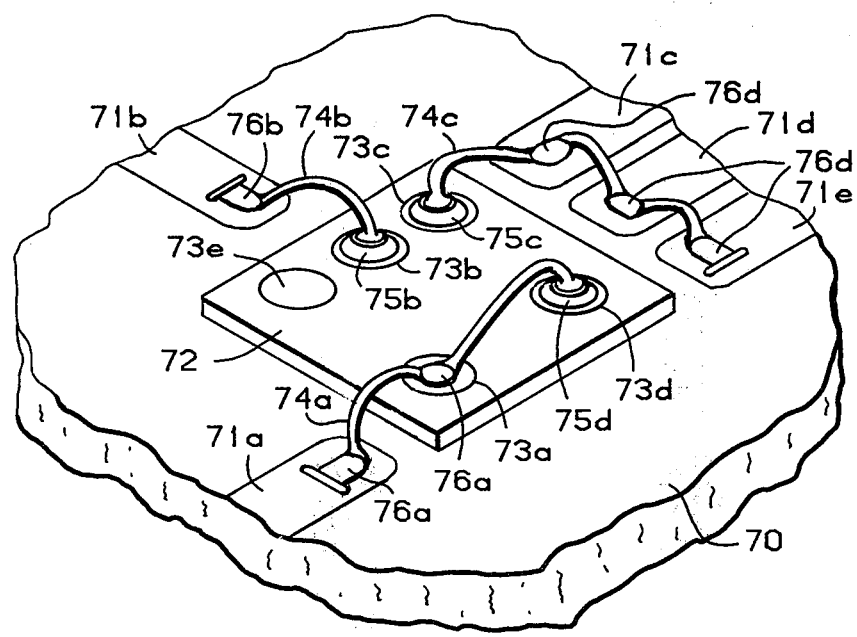
FIG. 7 shows, in simplified form, an electrical device consisting of a semiconductor die and a mounting base, each having multiple wire bonds.

FIG. 7 shows in schematic form an assembled electrical device consisting of mounting base 70 containing plated contact pad regions 71a–e and semiconductor die 72, having die contact regions 73a–e. Wires 74a–c are bonded between base 70 and die 72. Wire 74b contains a single ball bond 75b and a single stitch bond 76b. Wires 74a and 74c contain single ball bonds 75d and 75c respectively and multiple stitch bonds 76a and 76d, formed according to the method of this invention.

As used herein, "tool" refers to an apparatus for holding and manipulating a substrate and the capillary of the present invention to effectuate wire bonds on the substrate using pressure, heat, vibrational energy or a combination thereof.

Figure 8:
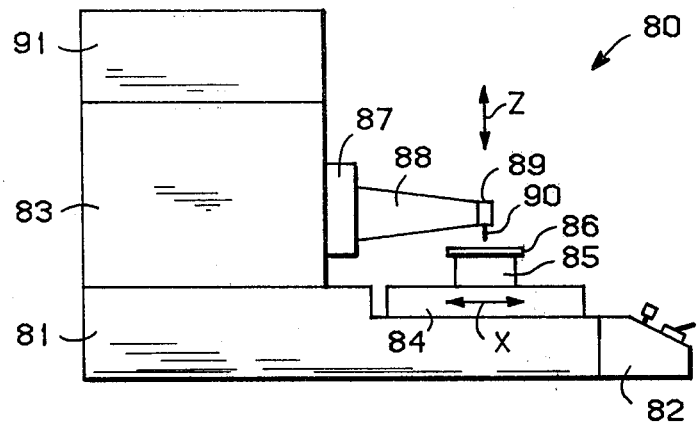
FIG. 8 shows, in simplified form, a side view of a bonding tool using the capillary of the present invention.

FIG. 8 shows, in schematic form, a side view of wire bonding tool 80 comprising base 81, control panel 82, and frame 83. X-Y moveable table 84 containing heater 85 and substrate or device holder 86 is mounted on base 81. Moveable head assembly 87 carries ultrasonic transducer 88, capillary chuck 89 and capillary 90 of the present invention. Ultrasonic transducer 88 is driven by ultrasonic generator 91. Capillary 90, may be moved vertically (Z direction) toward or away from substrate holder 86 by moving head assembly 87. In order for the stitch bonded region (e.g. region 51a of FIG. 5 or 76a of FIG. 7) to be of substantially uniform thickness, moveable head assembly 87 must be oriented so the portion of capillary bonding surface 31 of FIG. 3 or 61, 63 of FIGS. 6A-B which is in contact with the wire is substantially parallel to the substrate surface during bonding. Tool 80 is used in combination with capillary 90 of the present invention to perform ultrasonic, thermal compression or thermosonic bonds by methods to be described herein.

The following are examples of the practice of the method of the present invention:

Example 1

A capillary of the configuration shown in FIG. 3 is installed in a wire bonding apparatus of the type described in connection with FIG. 8 to form a tool. The substrate to be bonded is placed on the substrate holder. A wire of appropriate size is inserted into the bore of the capillary until it protrudes a small distance, e.g. several wire diameters from the bonding tip end.

A first (ball) bond is made without cutting the wire. This is conveniently done by first melting the tip of the wire to form a predetermined shape, such as a ball. The capillary and ball are then positioned over the first contact region of the substrate. The ball is then bonded to the first contact region by pressing the ball against the substrate by means of the capillary and applying heat, pressure, ultrasonic vibrational energy, or a combination thereof to the ball-substrate interface by methods well known in the art. Surface 18a of throat region 18 (FIG. 3) serves to press the ball against the substrate. Plastic deformation of the ball normally occurs, and a bonding region forms at the ball-substrate interface by welding of the wire and substrate materials.

Following completion of the first bond, the capillary is raised in the Z direction and moved relative to the substrate (e.g. through motion of the X-Y table) to a second contact region on the substrate. Wire feeds from the capillary during the above movements so that a bridge or loop of wire is formed between the two contact regions (e.g. see 74b of FIG. 7).

A second (stitch) bond is made by squashing or deforming the wire against the substrate in a second contact region by means of the capillary and applying heat, pressure, ultrasonic vibrational energy or a combination thereof to the wire-substrate interface. Bonding surface 31 (FIG. 3) serves to press the wire against the substrate. The wire is deformed to a thickness corresponding approximately to the height of cutting ridge 32 and a bonding region forms at the wire-substrate interface by welding of the wire and substrate materials. During the second bonding operation cutting ridge 32 penetrates the wire substantially to the substrate, allowing the portion of the wire remaining in the capillary to be separated from the bonded portions. It is not necessary that the cutting action totally sever wire 54 as long as any wire material remaining between cutting ridge 32 and substrate surface 56 is so thin as to fracture at line 50 when capillary 10 is raised.

In order for the bonded regions (e.g. region 51a of FIG. 5A) to have substantially uniform thickness, bonding surface 31 must be arranged to be substantially parallel to the substrate surface. Surface 40 of cutting ridge 32 will then also be substantially parallel to the substrate surface.

Example 2

A capillary of the configuration shown in FIGS. 6A–B is utilized in a tool capable of orienting the capillary in either configuration 6A or 6B with respect to the wire directions.

A first (ball) bond is formed, and the capillary raised and traversed as in Example 1. To make a second bond without cutting the wire, the capillary is oriented with the wire direction as shown in FIG. 6B. A second (stitch) bond is made as in Example 1, but there is no cutting action since cutting ridge 62 does not penetrate the wire.

The capillary is again raised and moved while feeding wire from the tip until a third contact region is reached, and then a third bond made in the same way as the second bond. This process is continued until the capillary is in position for the last ($N^{th}$) bond, whereupon the capillary is rotated to obtain the wire location shown in FIG. 6A. The final bond is made identically to the second bond of Example 1, including the cutting action to free the wire. In this way, N connected bonds are made. It will be apparent to those of skill in the art that a non-cutting stitch bond could be substituted for the initial ball bond, that is, using the capillary orientation of FIG. 6B to make the first bond.

Thus, there has been provided by the present invention, an improved bonding means giving bonds of equal or greater strength particularly on non-noble metals such as copper, an improved bonding means giving a bond region of substantially uniform thickness, and an improved bonding means having two regions on the bonding surface, one for providing the bonding action and a second non-coplanar with the first for providing cut-off of the bond wire. There has been further provided an improved process for producing single or multiple wire bonds to contact regions of substrates and for providing electrical devices having improved wire bonds.

While the present invention has been described in terms of particular means and methods, it will be apparent to those of skill in the art that many variations are possible within the context of the present invention. Accordingly, it is intended to encompass all such variations which fall within the spirit and scope of the present invention.

What is claimed is:

1. A process for making one or more wire bonds to a substrate comprising:
   providing a bonding capillary containing a central bore and on one end a substantially annular bonding surface surrounding said bore, said bonding surface having thereon and enclosing a raised ridge adjacent but not surrounding said bore, wherein said raised ridge has a height less than the thickness of said bonding wire;
   locating a bonding wire in said bore so that a first portion of said bonding wire protrudes from said one end;
   orienting said first portion of said bonding wire relative to said bonding surface, said raised ridge, and a first bonding pad on said substrate so that said first portion of said bonding wire lies between said bonding surface and said first bonding pad on said substrate and not between said raised ridge and said first bonding pad on said substrate;
   deforming said first portion of said bonding wire between said bonding surface and said first bonding pad on said substrate to establish a first bond region in said wire on said first bonding pad; and
   continuing said deforming step until said raised ridge contacts said first bonding pad, so as to limit the deformed height of said first portion of said bonding wire to an amount substantially corresponding to the height of said raised ridge.

2. The process of claim 1 adapted for making additional wire bonds to a substrate wherein the wire bonds are connected, further comprising:
   positioning said bonding capillary over an additional bonding pad for each additional wire bond, without severing said bonding wire;
   repeating said locating, orienting, deforming, and continuing steps with additional portions of said bonding wire for each additional wire bond less one; and
   for a last additional wire bond repeating said locating step; then
   orienting a last additional portion of said bonding wire relative to said bonding surface, said raised ridge, and a last additional bonding pad on said substrate so that said last additional portion of said bonding wire lies between said bonding surface and said last additional bonding pad on said substrate and between said raised ridge and said last additional bonding pad on said substrate; and thereafter
   repeating said deforming and continuing steps to form said last additional wire bond.

3. A process for bonding a wire to N points on a substrate where N is an integer greater than one, comprising:
   providing a bonding capillary containing a central bore and on one end a substantially annular bonding surface surrounding said bore, wherein said bonding surface includes a first portion and a second portion;
   providing a raised ridge on said one end of said bonding capillary adjacent to and not encircling said bore, wherein said raised ridge lies between said bore and said first portion of said bonding surface and not between said bore and said second portion of said bonding surface;
   locating a bonding wire in said bore so that said wire protrudes from said one end and passes beneath said second portion of said bonding surface and not beneath said raised ridge;
   bonding said wire to a first contact region of said substrate using heat, pressure, vibrational energy, or a combination thereof on said wire located between said second portion of said bonding surface and said first contact region;

moving said bonding capillary to a second contact region of said substrate;

feeding wire from said bore of said capillary to bridge between said first and second contact regions;

repeating said bonding step to bond said wire to said second contact region;

repeating said moving, feeding, and bonding steps at new contact region locations until N-1 bonds are complete;

repeating said moving and feeding steps for an Nth contact region;

orienting relatively said bonding wire and said capillary so that said bonding wire passes beneath said raised ridge and said first portion of said bonding surface; and bonding said wire to said Nth contact region of said substrate using heat, pressure, vibrational energy, or a combination thereof on said wire located between said first portion of said bonding surface and said Nth contact region.

4. The process of claim 3 wherein at least one said bonding step comprises deforming said wire to a substantially uniform thickness in a region being bonded.

5. The process of claim 4 wherein said pivoting step includes providing a capillary having a bore whose diameter increases adjacent to said bonding surface.

6. An improved bonding capillary for making wire bonds, said capillary having a central bore for receiving a wire to be bonded, the improvement comprising:

an end region centrally pierced by said bore;

an annular bonding surface on said end region, encircling said bore, and having a first and second portion;

a raised ridge on said end region, partly surrounding said bore and located between said bore and said first portion of said bonding surface and not between said bore and said second portion of said bonding surface;

wherein said raised ridge has a predetermined height above said annular bonding surface which is less than the thickness of said bonding wire.

7. The capillary of claim 6 wherein said predetermined height is in the range 0.5 to 0.40 x, said annular bonding surface has a substantially circular shape of radial width 2.0 to 1.6 x, said raised ridge has a radial width in the range of 0.5 to 0.25 x, said bore has a bore guide region of diameter in the range 1.5 to 1.2 x, said bore has a throat region of depth in the range 1.5 to 0.7 x where x is the diameter of the wire to be bonded, and wherein said throat region has an included angle of 90° to 150° and said ridge has an outer surface a portion of which makes an intersection angle with respect to said bonding surface in the range 90° to 150°.

8. The capillary of claim 7 wherein said included angle and said intersection angle are in the range 110° to 130°.

9. An improved bonding tool for bonding wires to contact pad surfaces of electrical devices, wherein the improvement comprises:

a bonding capillary having a central bore for receiving a wire to be bonded and a tapered end region pierced by said bore, said end region terminating in a substantially annular bonding surface having first and second portions;

a raised ridge of predetermined height formed on said bonding surface adjacent but not surrounding said bore and located between said bore and said first portion of said bonding surface and not between said bore and said second portion of said bonding surface; and orienting means for positioning said capillary and said bonding wire relative to each other and said contact pad so that, in a first bonding position said bonding wire passes between said contact pad and said second portion of said bonding surface, and in a second bonding position said bonding wire passes between said contact pad and the combination of said raised ridge and said first portion of said bonding surface.

10. A wire bonding and cutting capillary having an axial bore for receiving a wire to be bonded, said bore exiting said capillary at a first end which forms a bonding tip, comprising:

a first surface portion on said bonding tip adjacent to but not surrounding said bore and adapted for severing said wire when said capillary and said wire are oriented relatively so that said wire passes beneath said first surface portion; and a second surface portion on said bonding tip, surrounding said bore and enclosing said first surface portion, located non-coplanar with respect to said first surface portion, and adapted for deforming said wire to produce bonds.

11. The capillary of claim 10 wherein said second surface portion is recessed with respect to said first surface portion.

* * * * *

UNITED STATES PATENT AND TRADEMARK OFFICE
CERTIFICATE OF CORRECTION

PATENT NO. : 4,415,115
DATED : November 15, 1983
INVENTOR(S) : Kristi L. James

It is certified that error appears in the above–identified patent and that said Letters Patent are hereby corrected as shown below:

Claim 5, Column 11, line 24, "pivoting"

should read --providing--.

Signed and Sealed this

Twenty-eighth Day of February 1984

[SEAL]

Attest:

GERALD J. MOSSINGHOFF

Attesting Officer

Commissioner of Patents and Trademarks